United States Patent

Haginiwa et al.

[11] Patent Number: 6,130,751
[45] Date of Patent: Oct. 10, 2000

[54] POSITIONING METHOD AND APPARATUS

[75] Inventors: Kuniyasu Haginiwa, Yokohama; Yuichi Yamada, Utsunomiya, both of Japan

[73] Assignee: Canon Kabushiki Kaisha, Tokyo, Japan

[21] Appl. No.: 09/168,335

[22] Filed: Oct. 5, 1998

[30] Foreign Application Priority Data

Oct. 1, 1997 [JP] Japan .................................. 9-284675

[51] Int. Cl.[7] .................................................. G01N 11/00
[52] U.S. Cl. ......................... 356/401; 356/399; 250/548
[58] Field of Search .................... 356/399–401; 250/548

[56] References Cited

U.S. PATENT DOCUMENTS 5,751,428   5/1998   Kataoka et al. ........................ 356/401
5,783,833   7/1998   Sugaya et al. ......................... 356/401

FOREIGN PATENT DOCUMENTS 4-354320   12/1992   Japan .
6-260391    9/1994   Japan .

Primary Examiner—Robert H. Kim
Attorney, Agent, or Firm—Fitzpatrick, Cella, Harper & Scinto

[57] ABSTRACT

A positioning method of detecting a position of an object, fixed on a driving device, in a direction of height as a driving direction, by a surface position detector, while scanning the object in a direction perpendicular to the driving direction of the driving device and positioning and correction driving the object by the driving device to sequentially set the object at a predetermined position and a predetermined height. The method includes a step of monitoring a driving condition of the driving device in synchronism with a periodical detection performed by the surface position detector and a step of correcting a drive amount of the driving device on the basis of the periodical detection performed by the surface position detector and a result of the monitoring performed in the monitoring step. The correcting step includes the steps of (i) calculating a mean data of the drive amount by the driving device in one detecting period of the periodical detection performed by the surface position detector, on the basis of the result of the monitoring, and (ii) obtaining a correction amount of the driving on the basis of the mean data and the detection result of the surface position detector obtained in the one detecting period.

12 Claims, 6 Drawing Sheets

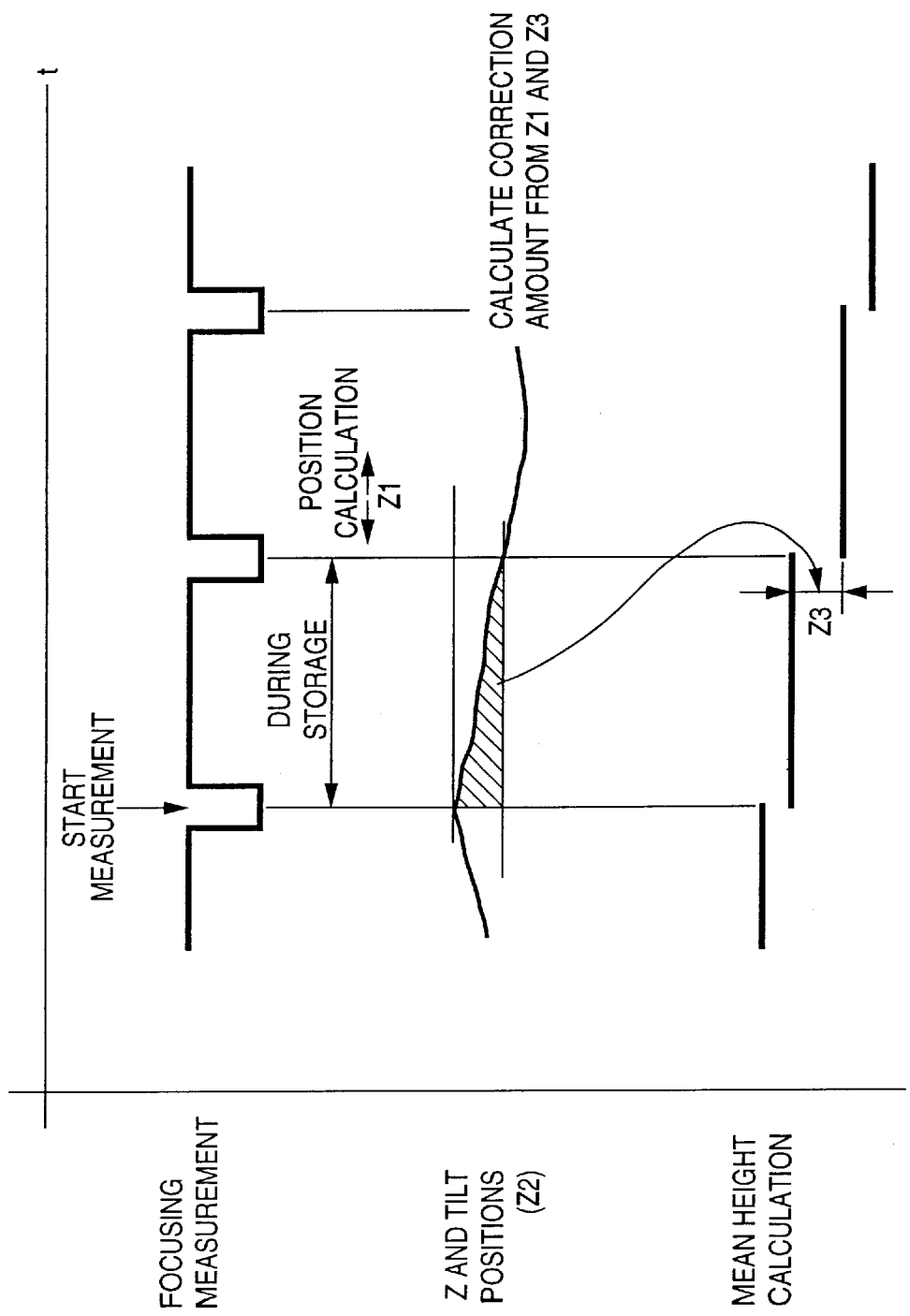

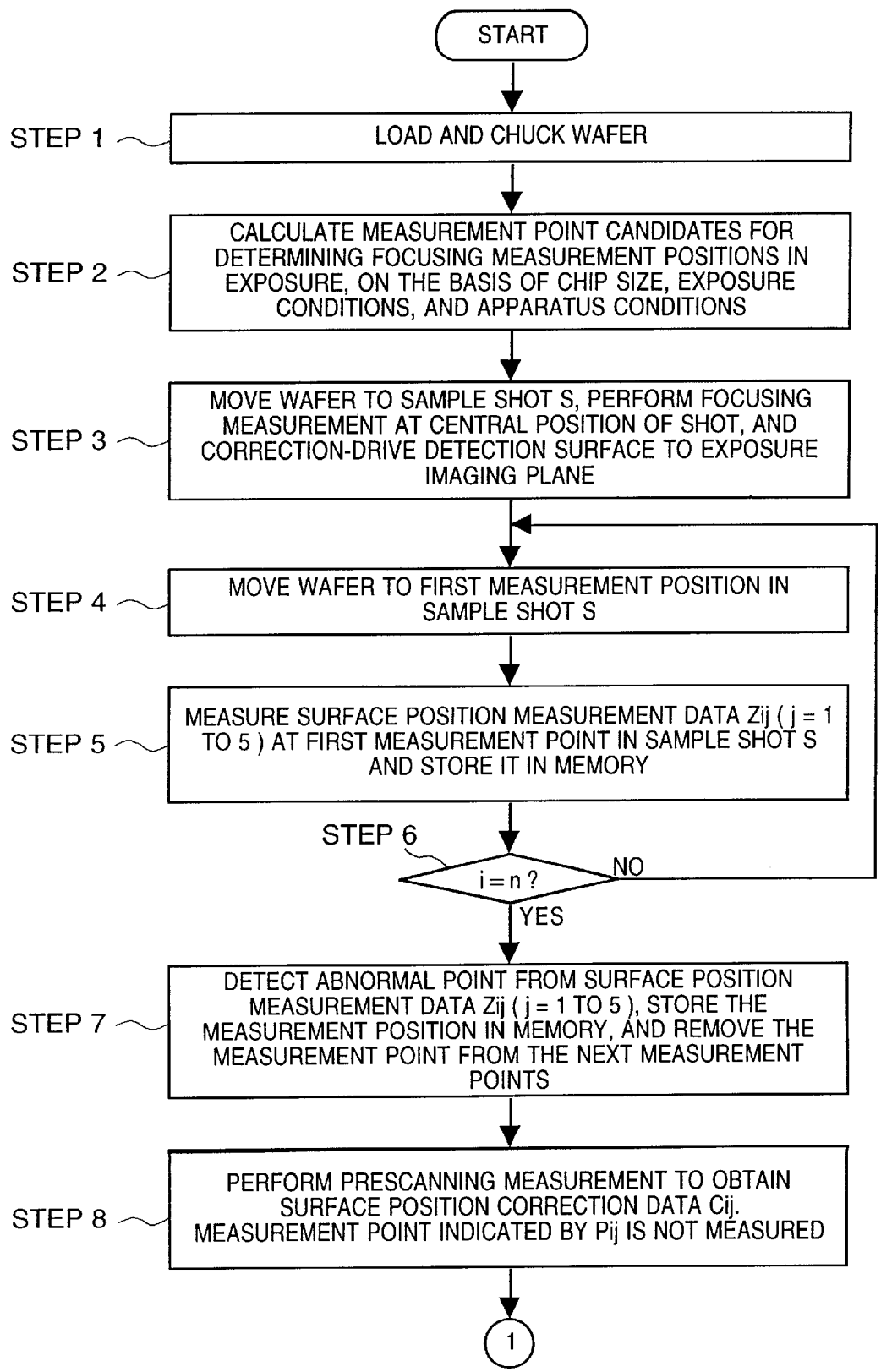

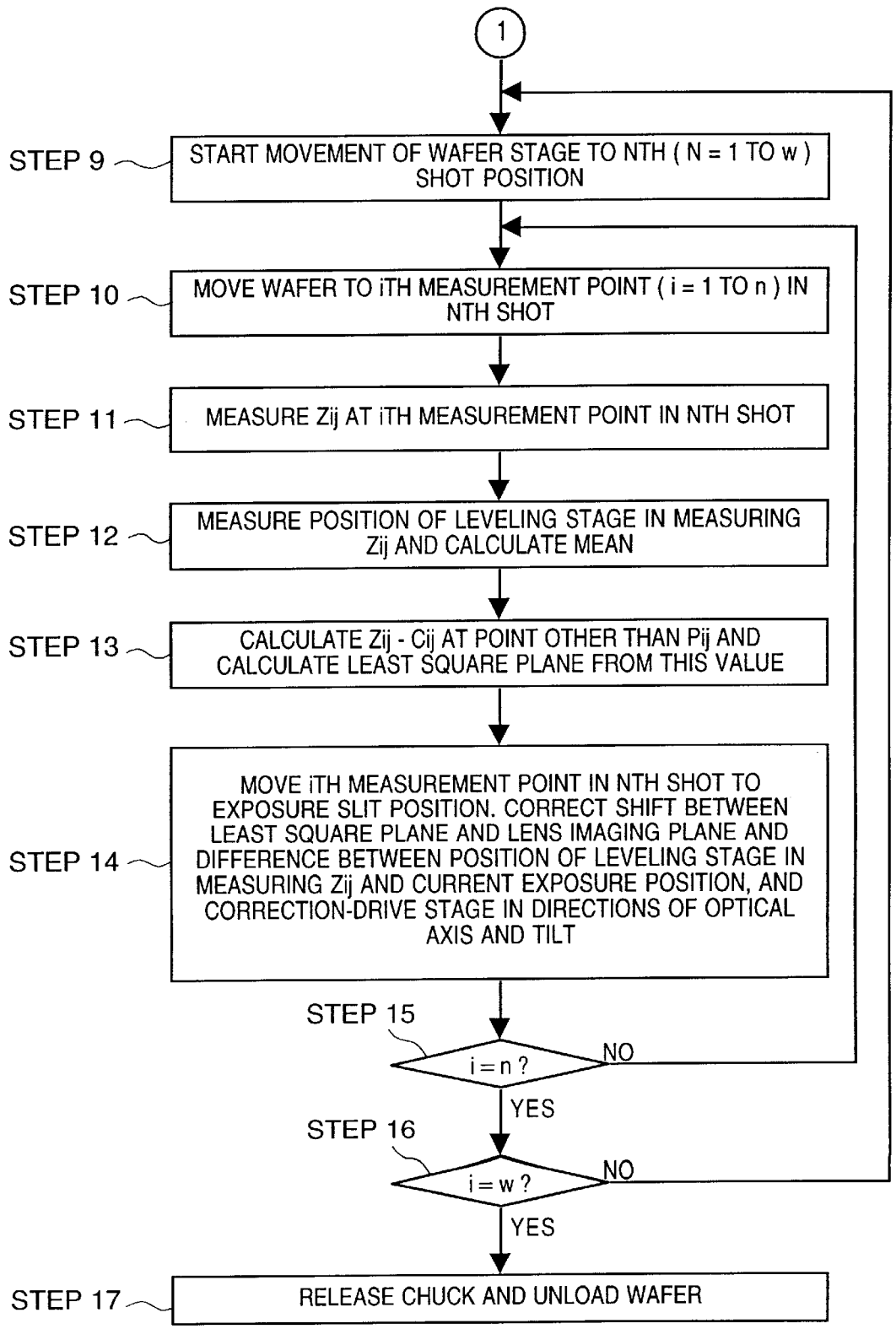

POSITIONING METHOD AND APPARATUS

BACKGROUND OF THE INVENTION

The present invention relates to a positioning method and apparatus for, e.g., a semiconductor exposure apparatus which is required to accurately detect the height and surface position of an object and, more particularly, a positioning method and apparatus suitable for accurate continuous detection of wafer surface position and tilt, which is required in a slit-scanning exposure apparatus.

Recently, the memory chip geometries are gradually increasing upon reflecting improvement in resolution line width of exposure apparatuses or an increase in cell size and memory capacity. For example, the first generation of 256M DRAMs has a chip size of about 14×25 mm. With this chip size, a reduction projecting exposure apparatus (stepper) which is currently used as a critical layer exposure apparatus and has a 31-mm diameter exposure area can expose only one chip per cycle, and the efficiency is low. Hence, the exposure apparatus is required to expose a larger area.

As a large-area exposure apparatus, conventionally, there is a rough layer exposure apparatus used in manufacturing a semiconductor device or an exposure apparatus for manufacturing a wide-screen liquid crystal display device such as a monitor, for which high throughput is required. The latter, i.e., the exposure apparatus for manufacturing a wide-screen liquid crystal display device is a so-called slit-scanning exposure apparatus using mask-wafer relative scanning. This exposure apparatus uses a reflection projecting optical system. An image of a pattern on a mask is formed on a wafer through a concentric reflecting mirror optical system. Arcuated slit illumination light is used for illumination. The mask is linearly scanned with respect to the slit, thereby fully exposing the entire area.

In the exposure operation, a wafer or a glass plate substrate to which a photoresist as a photosensitive agent is applied must be focused with respect to a mask image. In the above exposure apparatus, since the surface to be exposed is sequentially set on the best imaging plane of the projecting optical system, surface position measurement for detecting height and tilt and correction driving such as autofocusing/autoleveling are continuously performed even during scanning and exposure. As the surface position detection means for detecting height and tilt, an optical sensor is used. For example, an oblique incident optical system projects a light beam onto the surface of the wafer as a photosensitive substrate obliquely from the upper side, and the light reflected by the substrate is guided to the sensor to detect height and tilt on the basis of a positional shift on the sensor. Alternatively, a gap sensor such as an air microsensor or an electrostatic capacitance sensor is used. The heights of a plurality of substrates which are being scanned are measured by using such a sensor. The height and tilt correction driving amounts when the measurement area passes the exposure slit are calculated from the measurement value, and correction is performed.

However, as the circuit pattern continues to shrink in feature size and the NA of the reduction projecting system increases, the allowable focal depth in the circuit pattern transfer process becomes smaller. Currently, in the exposure apparatus for the rough process, an allowable depth of 5 µm or more is ensured, and measurement errors contained in the measurement values obtained by continuous measurement during scanning exposure or a step difference in a chip can be neglected. However, to cope with a 256M DRAM, the allowable depth is 1 µm or less. If the concept of the slit-scanning exposure apparatus currently in use is directly diverted to manufacture a 256M DRAM, and only the projecting optical system is improved, measurement errors or a step difference in a chip becomes large and cannot be neglected.

An example of measurement error generation in scanning is described in Japanese Patent Laid-Open No. 6-260391. In this prior art, a difference z in height/tilt between a wafer surface and an imaging plane, and the height/tilt of the stage at that time are detected at a measurement position before the exposure area. As the characteristic feature of this control method, when the detected area reaches the exposure area, the height of the area is set at a value obtained by adding the difference z to the detected height of the stage. To obtain the control amount, the focusing measurement values are subjected to mean processing to relax the influence of unevenness on the wafer surface. As for stage position, however, an immediate measurement value is used because there is no concept of storage time.

Assume that the correction amount at the periphery is 2 µm, and correction is performed in 50 msec. The height and tilt are continuously measured even while the stage is being driven by 2 µm in 50 msec. Assuming that the storage time is 5 msec, and the correction driving pattern is linear, the moving amount along the Z-axis in the storage time is 0.2 µm. As described above, a storage time error is contained in measurement during driving, and a correction error around 0.2 µm at maximum is generated in immediate control.

In the exposure sequence of the conventional stepper, exposure is started after correction of focusing (height and tilt) at the exposure position is completed. That is, serial processing is performed. For this reason, exposure can be performed in a stationary state after focusing measurement and driving are completed. However, the slit-scanning exposure sequence is performed in parallel processing. That is, exposure is performed even during focusing measurement. Hence, the two processing operations, focusing measurement driving and exposure, must be simultaneously accurately performed. Any positional and time shifts between the focusing measurement position and the exposure position, and the height position of the leveling stage in focusing measurement, must be carefully monitored.

In slit-scanning, focusing measurement, correction driving, and exposure are simultaneously done during scanning. For this reason, the focusing measurement position to be detected by the surface position detection means must be set in front of the exposure position in the scanning direction. This is because focusing driving correction must be ended before the focusing measurement point reaches the exposure slit position.

When a storage sensor is used for focusing measurement, the mean of measurement values in the storage time is obtained as measurement data. The exposure apparatus always vertically moves the leveling stage for exposure. If the height and tilt positions of the leveling stage in focusing measurement are simply measured and corrected, accurate wafer height and tilt correction cannot be realized.

SUMMARY OF THE INVENTION

The present invention has been made in consideration of the above conventional problem, and has as its object to provide a positioning method of accurately positioning the height and tilt positions of a leveling stage in focusing measurement performed during scanning, particularly, in a slit-scanning exposure scheme, and a positioning apparatus using the method.

In order to achieve the above object, according to the present invention, there is provided a positioning method comprising the steps of, in focusing measurement at a measurement position of surface position detection means in scanning exposure, detecting a height and tilt of a leveling stage and continuously detecting a surface position of a wafer by relative scanning, and processing detection values to continuously detect a feature amount of a surface state while relatively scanning a surface position of the wafer, continuously detecting height and tilt amounts of the leveling stage in synchronism with detection of the feature amount of the surface state of the wafer, performing statistical computation of the height and tilt amounts of the leveling stage, and processing the continuously obtained feature amount and the statistical computation result to align the wafer surface with an imaging plane at an exposure position.

As described above, according to the present invention, even when the surface measurement value during Z and leveling driving of the apparatus is used, accurate Z and leveling correction amounts can be calculated. In the present invention, highly accurate focusing and leveling correction can be performed at a high speed. For this reason, this method is suitable for a slit-scanning exposure apparatus. Consequently, for a highly integrated chip such as a 256M DRAM, satisfactory pattern transfer can be performed at high throughput. Therefore, a finely micropatterned LSI chip can be stably manufactured to contribute to semiconductor production.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 is an explanatory view showing a mean calculation method; and

FIGS. 5A and 5B are flow charts of an exposure scheme using the present invention.

DETAILED DESCRIPTION OF THE PREFERRED EMBODIMENT

Figure 1:
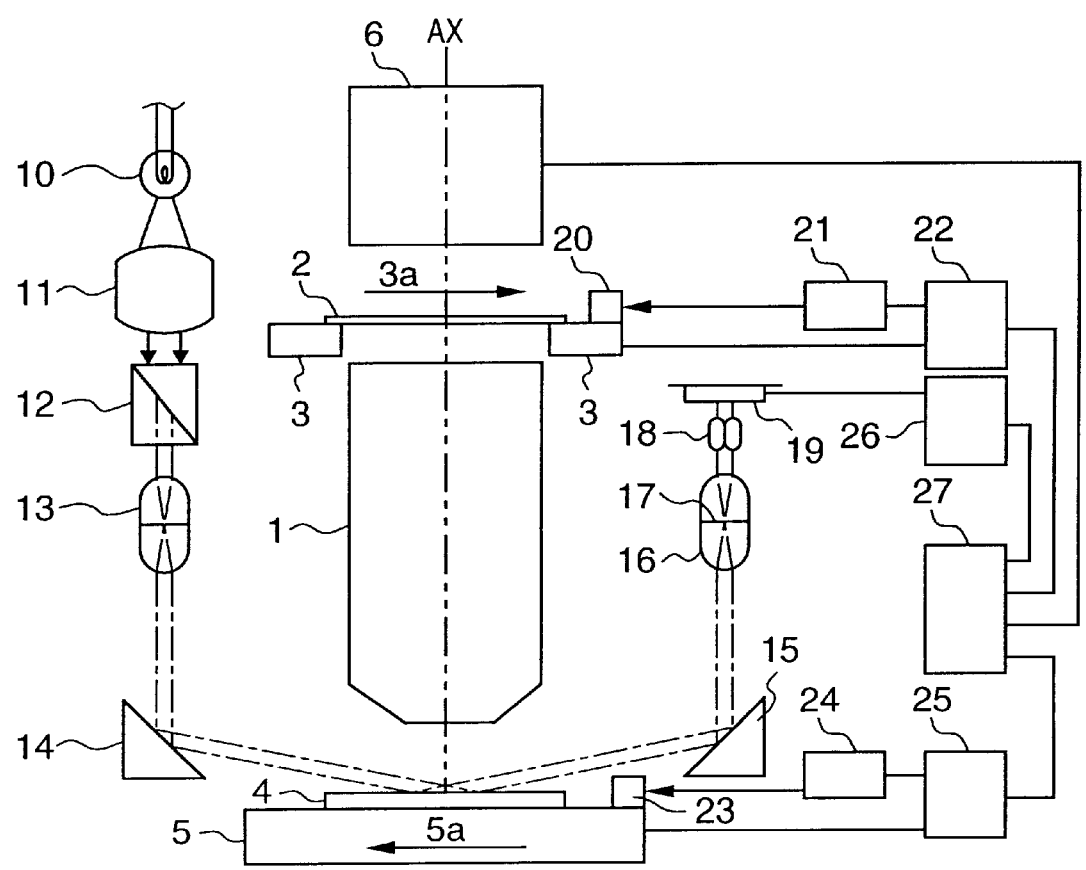
FIG. 1 is a schematic view showing the exposure system of a slit-scanning projecting exposure apparatus using a surface position detection method of the present invention.

FIG. 1 is a schematic view of a slit-scanning projecting exposure apparatus using a positioning method according to an embodiment of the present invention. Referring to FIG. 1, a reduction projecting lens 1 with an optical axis AX has an imaging plane perpendicular to the Z direction. A reticle 2 is held on a reticle stage 3. A pattern on the reticle 2 is reduced to ¼ to ½ in accordance with the magnification of the reduction projecting lens 1 and projected. A wafer 4 with a resist applied to its surface has an array of a number of areas (shots) to be exposed in the exposure process.

The wafer 4 is mounted on a wafer stage 5. The wafer stage 5 comprises driving mechanisms such as a chuck for chucking and fixing the wafer 4 on the wafer stage 5, an X-Y stage horizontally movable along the X- and Y-axes, a leveling stage movable along the Z-axis, i.e., the optical axis of the reduction projecting lens 1 and rotatable about axes parallel to the X- and Y-axes, and a rotary stage rotatable about the Z-axis. The wafer stage 5 constitutes a six-axes correction system for aligning the reticle pattern image with the exposure area on the wafer 4.

Reference numerals 10 to 19 denote elements of a focusing detection system for detecting the surface position and tilt of the wafer 4. In FIG. 1, the light source 10 is an illumination unit serving as a light irradiation means for emitting light from a white lamp or a high-luminance light-emitting diode having a plurality of different peak wavelengths. The collimator lens 11 collimates the light beam from the light source 10 into a beam having an almost uniform sectional intensity distribution. The slit member 12 having a prism shape generates slit-shaped light to be projected on the wafer. In FIG. 1, the slit member 12 is formed by bonding slant surfaces of a pair of prisms and forming a plurality of apertures in the bonded surface by patterning a light-shielding film of, e.g., chromium. For the convenience of descriptive, assume that ten pinholes are formed on the chromium film.

The lens system 13 is double-sided telecentric and guides ten independent light beams passing through the ten pinholes of the slit member 12 to ten measurement points on the wafer 4 through the mirror 14. In FIG. 1, only two light beams are illustrated; In fact, five light beams overlap in a direction perpendicular to the figure, i.e., a total of ten light beams are present. A plane including the lens system 13, the slant surface of the prism where the pinholes are formed, and the surface of the wafer 4 optically satisfies the condition of Scheimpflug.

In this embodiment, an incident angle $\Phi$ of each light beam from the light irradiation means on the surface of the wafer 4 is set to be 70° or more. The incident angle $\Phi$ is an angle formed by a perpendicular (Z-axis) to the surface of the wafer 4 and the incident light beam. A plurality of pattern areas formed in the exposure process are arrayed in order on the surface of the wafer 4.

Figure 2:
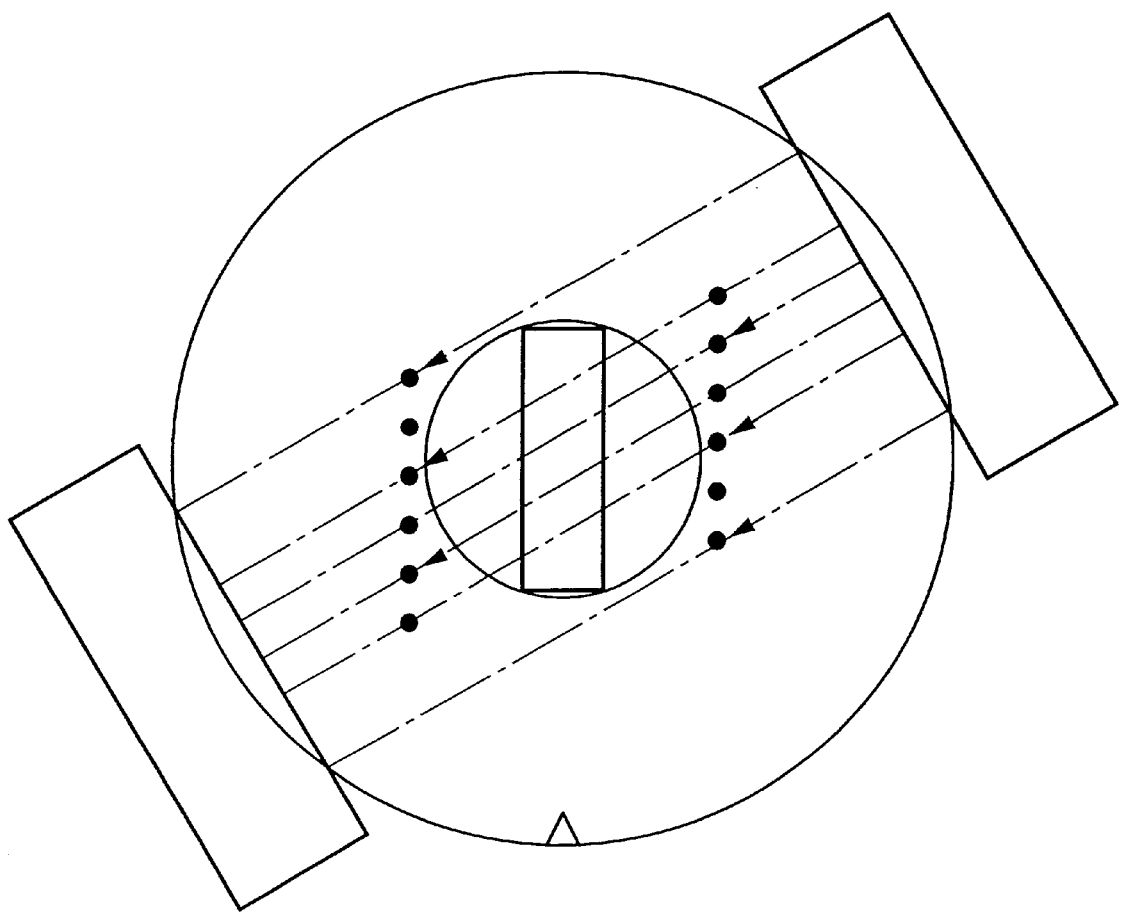
FIG. 2 is a view showing the positional relationship between the exposure slit and each measurement point in surface position detection by a wafer surface position detection system.

The ten light beams passing through the lens system 13 are incident on the measurement points fixed with respect to the apparatus independently of the pattern array on the wafer and form images, as shown in FIG. 2. Since the ten measurement points are independently observed, the incident direction when each light beam from the light irradiation means is projected in the X-Y plane is oblique with respect to the X- and Y-axes. For example, letting $\theta$ be the incident angle with respect to the X-axis, $\theta$ is set at 22.5°. The arrangement of the light irradiation means has been proposed by the present inventor in Japanese Patent Laid-Open No. 4-354320. With this arrangement, the spacial arrangement of each optical element is optimized, and the surface position information can be accurately detected.

Elements 15 to 19 constructing a light-receiving system used in this embodiment to detect the light beam reflected by the wafer 4 will be described next. The ten light beams reflected by the wafer 4 are guided, through the reflecting mirror 15, to the double-sided telecentric light-receiving lens 16. The stopper aperture 17 in the light-receiving lens 16 is common to the ten light beams and cuts higher order diffracted light which is generated by the circuit pattern on the wafer 4 and becomes a noise component in detection.

The axes of the light beams transmitted through the light-receiving lens 16 are parallel to each other. The light beams form spot light images having equal sizes on the detection surface of the photoelectric conversion means group 19 through the correction lenses of the group of correction optical systems 18 for the ten light beams, respectively. The photoelectric conversion means group 19 comprises ten one-dimensional CCD line sensors corresponding to the measurement points. The elements 16 to 18 on the light-receiving system side perform tilt correction such that each measurement point on the surface of the wafer 4 is conjugate to the detection surface of the photoelectric conversion means group 19. For this reason, local tilt at each measurement point does not change the pinhole image position on the detection surface. The pinhole image position on the detection surface changes in correspondence with a change in height in the Z direction at each measurement point.

The photoelectric conversion means group 19 comprising one-dimensional line sensors is more advantageous than the conventional arrangement using a two-dimensional sensor in the following three points. First, it is advantageous in arrangement of the optical system. Since ten photoelectric conversion means can be separately arranged in correspondence with the correction optical system group 18, the degree of freedom in layout of the optical members or mechanical holders largely increases. The second advantage is detection resolving power. To improve the detection resolving power, the optical magnification from the mirror 15 to the correction optical system group 18 must be made large. However, since the degree of freedom in layout of the optical system increases, and the optical path can be divided to input the light beams to the individual sensors, the members can be assembled compact to set a large magnification. The third advantage is a shorter measurement time. In slit-scanning, it is essential to continuously measure focusing during exposure, so shortening the measurement time is a large challenge. In the conventional two-dimensional CCD sensor, data more than necessary need be read, and this requires a long time. However, the one-dimensional CCD sensor can shorten the read time to 1/10or less than that of the two-dimensional CCD sensor.

Units associated with focusing in the exposure apparatus have been described above. Next, the slit-scanning exposure system will be described.

As shown in FIG. 1, the reticle 2 is chucked and fixed on the reticle stage 3 and then scanned at a predetermined speed in the RX direction (X-axis direction) in a plane perpendicular to the optical axis AX (Z-axis) of the projecting lens. At this time, correction driving is performed in the RY direction (Y-axis direction) perpendicular to the scanning direction to always scan the target coordinate positions. The positional information of the reticle stage in the X- and Y-directions is always measured by irradiating a plurality of laser beams from a reticle stage interferometer 21 onto an X-Y bar mirror 20 fixed on the reticle stage 3. As the light source, an excimer laser for emitting pulse light or the like is used. An exposure illumination optical system 6 comprising a beam shaping optical system, an optical integrator, a collimator, and a mirror (none are shown) efficiently guides pulse light in the far UV range. The beam shaping optical system shapes the incoming beam into desired a sectional shape and size. The optical integrator unifies the distribution characteristics of the light beam to illuminate the reticle 2 at a uniform illuminance. The exposure illumination optical system 6 incorporates a masking blade (not shown) to set a rectangular illumination area corresponding to the chip size. The pattern on the reticle 2 partially illuminated in the illumination area is projected on the wafer 4, which is applied with a resist, through the reduction projecting lens 1, and the entire area is exposed by scanning.

A main control section 27 controls the entire system in accordance with scanning such that the image of the illuminated rectangular area of the reticle 2 is formed in a predetermined area on the wafer 4. For the wafer 4, the position in the X-Y plane, i.e., the x- and y-coordinate values, a rotation angle θ about an axis parallel to the Z-axis and the position in the Z-direction, i.e., the z-coordinate value and rotation angles α and β about axes parallel to the X- and Y-axes, respectively, are controlled.

Positioning of the reticle 2 and the wafer 4 in the X-Y plane is realized by calculating control data from position data from the reticle stage interferometer 21 and a wafer interferometer 24 and wafer position data obtained from an alignment microscope (not shown) and controlling a reticle position control system 22 and a wafer position control system 25. When the reticle stage 3 is scanned in a direction indicated by an arrow 3a, the wafer stage 5 is scanned in a direction indicated by an arrow 5a at a speed corrected by the reduction magnification of the projecting lens. The scanning speed of the reticle stage 3 depends on the scanning-direction width of the masking blade (not shown) in the exposure illumination optical system 6 and the sensitivity of the resist applied to the surface of the wafer 4 and is set to increase the throughput.

Positioning in the Z-axis direction and for the rotation angles α and β about the axes parallel to the X- and Y-axes, i.e., positioning to the imaging plane is performed by the wafer position control system 25 which controls the leveling stage in the wafer stage on the basis of the detection result from a surface position detection system 26 for detecting height data of the wafer 4. On the basis of height data of five wafer height measurement light spots formed near the slit in the scanning direction, the surface position detection system 26 detects tilt in the scanning direction and in a direction perpendicular to the scanning direction and height in the Z-axis direction. The correction amount to the optimum imaging plane position at the exposure position is calculated from the detection values, and driving is performed.

FIG. 4 is a view for explaining a method of calculating the correction value using a mean method. In FIG. 4, Z1 represents the calculated value of the distance between the imaging plane and the wafer surface, and Z2 represents the concept of determining the correction amount in the exposure area from the wafer height holding position in measurement. At the measurement start point in FIG. 4, correction in the direction of height of the stage has already been continuously performed on the basis of data of one measurement point before. During storage time t0, measurement and correction for the height of the stage are independently performed, as is indicated by the hatched portion in FIG. 4. As the characteristic feature of the present invention, since the focusing measurement data obtained by measurement using the focusing detection system include both wafer surface height data and change amount of stage height correction, the correction amount in the exposure area is obtained from mean height data Z3 considering the calculated value Z1 of the distance between the imaging plane and the wafer surface obtained by the focusing detection system as a correction control amount, and the stage position change amount which is being measured.

When the focusing detection position is very close to the exposure area, correction is performed using the difference data. However, as the characteristic feature of the present invention, when the detection position and the exposure position are separated, as in slit-scanning exposure, the tilt amount in the scanning direction of the stage or the stage height to the exposure slit reaching position must be converted, and correction must be performed in consideration of the difference between the converted value and the measurement data at the detection position.

The leveling stage height is converted by statistical computation. For example, a method using the mean of multiple samples of measurement values, a method using the mean of stage positions before and after storage time t0, or a method using the mean of control data can be used.

Correction in the direction of height has been described above. This also applies to correction in the direction of tilt. In this case, since the control amount in the direction of tilt during measurement and storage is included in the calculated value of the focusing tilt correction amount, the difference value is managed.

Figure 3:
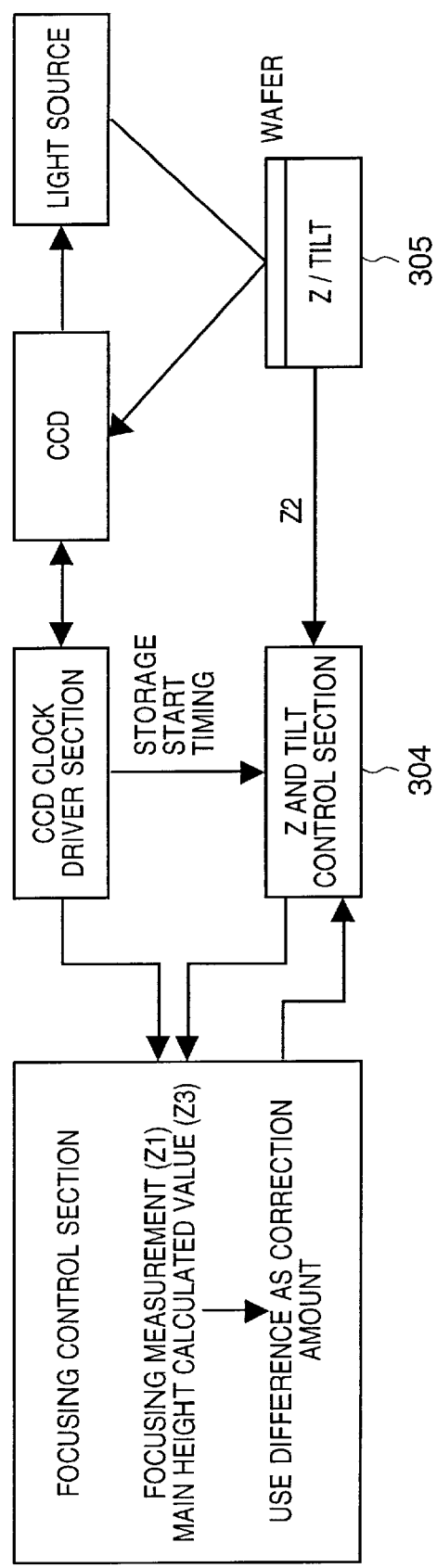
FIG. 3 is an explanatory view showing synchronization of the correction timing.

FIG. 3 is a view for explaining synchronous control of focusing measurement and stage height measurement in the present invention. The focusing control section in the wafer position control system 25 manages the measurement start point or calculates the amount to be corrected when the portion measured on the basis of the measurement data reaches the exposure area. A CCD clock driver is a clock generation section of the CCD sensor used as a surface position detection sensor. The CCD clock driver refreshes the storage cycle in response to a measurement start instruction from the focusing control section. A Z and TILT (leveling) control section incorporated in the wafer position control system 25 chucks the wafer and performs Z and TILT correction driving with respect to the imaging plane. The Z and leveling stage is driven in accordance with a driving instruction from the focusing control section. Simultaneously, the mean position during storage can be obtained in accordance with the CCD storage start timing, or the current Z or leveling stage value can be immediately read.

In the wafer position control system 25 having the above arrangement, the focusing control section issues a measurement instruction to the CCD clock driver at the focusing detection position to read the focusing detection waveform, and the Z and TILT control section reads the mean height of the Z and leveling stage positions corresponding to the CCD storage time.

Although the height of the wafer surface is detected during movement correction, the correction amount between the wafer surface and the imaging plane excluding the change amount of movement correction can be obtained by calculating the focusing correction amount Z2 on the basis of the two data, the focusing measurement value Z1 and the mean height measurement value Z3.

FIG. 5 shows a correction sequence using the present invention. In step 1, a wafer is loaded and fixed on the chuck. In step 2, measurement points for prescanning 1 in which the measurement positions are examined in advance on the basis of the chip size, the exposure conditions, and the apparatus conditions, i.e., candidate points for focusing measurement which are to be used in prescanning 2 or exposure are calculated. As the measurement point candidates, a necessary and sufficient number of measurement points are calculated on the basis of the sampling theorem or the response time of the correction system. At the stage of step 2, it is more advantageous for measurement point determination in step 7 later to calculate a relatively large number of measurement points to be used in exposure. If the object to be exposed is not for the first patterning process, i.e., 1st print, the entire wafer is subjected to alignment measurement, thereby completing positioning.

In step 3, a shot near the wafer center where the influence of the chuck is small is selected as a sample shot S, i.e., the measurement object in prescanning 1. Focusing position correction is performed at the center of the shot. In step 4, in accordance with selection of one of the measurement point candidates set in step 2, the wafer is moved to the first measurement point in the sample shot S. A focusing measurement value Zij (j=1, 6) is measured at the measurement point and stored in a memory. The flow advances to step 5. This measurement is repeated in step 6 up to a predetermined nth measurement point. This repetitive operation is prescanning 1.

In step 7, arithmetic processing is performed using all measurement values Zij stored in the memory. In step 7, an approximate curve is obtained from the behavior of all measurement values. Then, for each measurement point, suitability of measurement is determined by calculating the deviation between the actual measurement value and the obtained approximate curve. When the deviation value exceeds a predetermined value, it is determined that a measurement point Pij is inappropriate, and the measurement point is removed from the measurement points in actual scanning exposure. It is a special portion such as a scribing portion that generates an abnormal value exceeding the predetermined value. For this reason, in actual selection, points where the correction cycle is almost periodical and the measurement value smoothly changes are employed. In some cases, the surface shape may have excessive unevenness, or in a special case, measurement point selection may fail. However, all the five measurement points need not be valid. As far as the span is sufficient, the TILT amount can also be calculated with at least two points.

In this manner, the nature of the wafer pattern is checked. In step 7, in consideration of the response speed of correction driving, minimum and necessary measurement points in exposure are finally determined while avoiding local distribution of measurement points selected.

In step 8, prescanning 2 is executed to measure surface position correction data Cij as an offset in the measurement system due to, e.g., unevenness on the resist surface by using the finally determined measurement points. At this time, the removed measurement points Pij are not measured.

With the above processing, all parameters, i.e., measurement points used to scan and expose the actual wafer are selected, and the offset for each measurement point is obtained, thus completing preparation for exposure.

The sequence from step 9 to step 16 represents the actual wafer exposure procedure. In step 9, the wafer stage starts to move to the first measurement point (i=1) in the first shot (N=1). In step 10, the wafer stage is moved to the first measurement point in the first shot. In step 11, a focusing measurement value Z1j (j=1 to 5) at the first measurement point in the first shot is measured. In step 12, in measuring the leveling stage position during measurement of the focusing measurement value Z1j, the timing of storage is detected by hardware or software during storage in the focusing measurement sensor, and the mean position of the leveling stage during the storage time is obtained, thereby determining the accurate leveling stage position for exposure.

In step 13,

Z1j−C1j is calculated from the focusing measurement value Z1j and surface position correction data C1j at a point other than the measurement point P1j. The correction driving value in the Z-axis direction is calculated from this value, and the TILT correction driving value is obtained by calculating the least square plane. All driving parameters at the first measurement point in the first shot are obtained. In step 14, the first measurement point in the first shot is moved to the exposure slit position. Any shift between the least square plane and the lens imaging plane, and the difference between the TILT (leveling) stage position in measuring the focusing measurement value Z1j and the current exposure position is corrected, thereby correcting and driving the stage in the Z-axis direction as the optical axis direction and in the tilt direction.

Processing at the first measurement point in the first shot is ended. In step 15, the operation enters a loop so that control using a focusing measurement value Z2j and a surface position correction data C2j is performed at the second measurement point in the first shot. When processing up to the nth measurement point in the first shot is ended, loop processing starts in step 16 to move the stage to the second shot. When exposure of all exposure shots to be exposed is complete, the wafer is recovered in step 17.

In this embodiment, as the storage sensor, a CCD sensor using optical detection is used. The present invention can be applied even when the mean of measurement values is obtained as a focusing measurement value using another sensor such as an electrostatic sensor, an air sensor, or a photodiode. In this case as well, when the correction amount is calculated using the mean height of the Z and leveling stage positions in the mean value calculation period, the actual Z and leveling correction amounts can be calculated while removing the influence of correction driving even when focusing is measured during correction driving.

As many apparently widely different embodiments of the present invention can be made without departing from the spirit and scope thereof, it is to be understood that the invention is not limited to the specific embodiments thereof except as defined in the appended claims.

What is claimed is:

1. A positioning method of detecting a position of an object, fixed on driving means, in a direction of height as a driving direction, by surface position detection means, while scanning the object in a direction perpendicular to the driving direction of the driving means and positioning and correction driving the object by the driving means to sequentially set the object at a predetermined position and a predetermined height, said method comprising:

a step of monitoring a driving condition of the driving means in synchronism with a periodical detection performed by the surface position detection means; and a step of correcting a drive amount of the driving means on the basis of the periodical detection performed by the surface position detection means and a result of the monitoring performed in said monitoring step, said correcting step including the steps of (i) calculating a mean data of the drive amount by the driving means in one detecting period of the periodical detection performed by the surface position detection means, on the basis of the result of the monitoring, and (ii) obtaining a correction amount of the driving on the basis of the mean data and the detection result of the surface position detection means obtained in the one detecting period.

2. The method according to claim 1, further comprising setting a detection position of the surface position detection means in front of the predetermined position in a scanning direction.

3. The method according to claim 2, wherein the surface position detection means performs the detection at a plurality of detection points.

4. The method according to claim 3, further comprising simultaneously correcting, by positioning and correction driving, the height of the object and a tilt of the object.

5. The method according to claim 4, further comprising obtaining the correction driving amount by calculating the mean data of the drive amount by means of a statistical computation of the monitoring result.

6. The method according to claim 5, further comprising performing the statistical computation using a multiple sample mean of the correction driving amounts.

7. The method according to claim 5, further comprising performing the statistical computation using a mean of positions of a stage, which supports the object, before and after the detection period.

8. The method according to claim 5, further comprising performing the statistical computation using a mean of control data of the correction driving amounts.

9. The method according to claim 1, further comprising checking a measurement suitability between the object and a measurement point formed by the surface position detection means on a surface of the object during the scanning.

10. The method according to claim 9, further comprising, in checking the measurement suitability, prescanning the object, obtaining an approximate curve of data obtained by the prescanning, and when a deviation amount of the data from the approximate curve exceeds a predetermined value, removing the measurement point giving the data as an inappropriate point.

11. A positioning apparatus for detecting a position of an object, fixed on driving means, in a direction of height as a driving direction, by surface position detection means, while scanning the object in a direction perpendicular to the driving direction of the driving means and positioning and correction driving the object by the driving means to sequentially set the object at a predetermined position and a predetermined height, said apparatus comprising:

monitoring means for monitoring a driving condition of the driving means in synchronism with a periodical detection performed by the surface position detection means; and correction means for correcting a drive amount of the driving means on the basis of the periodical detection performed by the surface position detection means and a result of the monitoring performed by said monitoring means, wherein said correction means comprises (i) calculating means for calculating a mean data of a drive amount by the driving means in one detecting period of the periodical detection performed by the surface position detection means, on the basis of the result of the monitoring, and (ii) means for obtaining a correction amount of driving on the basis of the mean data and the detection result of the surface position detection means obtained in the one detecting period.

12. An exposure apparatus comprising:

a positioning apparatus for detecting a position of an object, fixed on driving means, in a direction of height as a driving direction, by surface position detection means, while scanning the object in a direction perpendicular to the driving direction of the driving means and positioning and correction driving the object by the driving means to sequentially set the object at a predetermined position and a predetermined height, said positioning apparatus comprising (i) monitoring means for monitoring a driving condition of the driving means in synchronism with a periodical detection performed by the surface position detection means, and (ii) correction means for correcting a drive amount of the driving means on the basis of the periodical detection performed by the surface position detection means and a result of the monitoring performed by said monitoring means, said correction means comprising (a) calculating means for calculating a mean data of a drive amount by the driving means in one detecting period of the periodical detection performed by the surface position detection means, on the basis of the result of the monitoring, and (b) means for obtaining a correction amount of driving on the basis of the mean data and a detection result of the surface position detection means obtained in the one detecting period; and exposure means for exposing the object.

* * * * *

UNITED STATES PATENT AND TRADEMARK OFFICE
CERTIFICATE OF CORRECTION

PATENT NO. : 6,130,751
DATED : October 10, 2000
INVENTOR(S) : Kuniyasu Haginiwa et al.

It is certified that error appears in the above-identified patent and that said Letters Patent is hereby corrected as shown below:

Title page,
Item [22], Filed: "Oct. 5, 1998" should read -- Sept. 28, 1998 --.

Column 3,
Line 64, "1/4to 1/2in" should read -- $1/4$ to $½$ in. --.

Column 4,
Line 25, "descriptive" should read -- description --.
Line 31, "illustrated;" should read -- illustrated. --.

Column 5,
Line 39, "$1/10$or" should read -- $1/10$ or --.
Line 61, "desired a" should read -- a desired --.

Column 7,
Line 55, "Instep 1," should read -- In step 1, --.

Signed and Sealed this

Nineteenth Day of March, 2002

Attest:

JAMES E. ROGAN
Director of the United States Patent and Trademark Office

*Attesting Officer*

UNITED STATES PATENT AND TRADEMARK OFFICE
CERTIFICATE OF CORRECTION

PATENT NO. : 6,130,751  
APPLICATION NO. : 09/168335  
DATED : October 10, 2000  
INVENTOR(S) : Kuniyasu Haginiwa et al.

Page 1 of 1

It is certified that error appears in the above-identified patent and that said Letters Patent is hereby corrected as shown below:

<u>TITLE PAGE AT ITEM NO. [22]</u>:
Filed: "Oct. 5, 1998" should read --Sept. 28, 1998--.

<u>COLUMN 3</u>:
Line 64, "1/4to 1/2in" should read --1/4 to ½ in.--.

<u>COLUMN 4</u>:
Line 25, "descriptive" should read --description--.
Line 31, "illustrated;" should read --illustrated.--.

<u>COLUMN 5</u>:
Line 39, "1/10or" should read --1/10 or--.
Line 61, "desired a" should read --a desired--.

<u>COLUMN 7</u>:
Line 55, "Instep 1," should read --In step 1,--.

Signed and Sealed this

Nineteenth Day of February, 2008

JON W. DUDAS  
*Director of the United States Patent and Trademark Office*